United States Patent
Liu

(10) Patent No.: US 7,098,076 B2
(45) Date of Patent: Aug. 29, 2006

(54) FLIP-CHIP ATTACH STRUCTURE AND METHOD

(75) Inventor: Shuan Ta Liu, Yunghe (TW)

(73) Assignee: Gigno Technology Co., Ltd., Taipei (TW)

( * ) Notice: Subject to any disclaimer, the term of this patent is extended or adjusted under 35 U.S.C. 154(b) by 0 days.

(21) Appl. No.: 10/856,796

(22) Filed: Jun. 1, 2004

(65) Prior Publication Data
US 2004/0245654 A1 Dec. 9, 2004

(30) Foreign Application Priority Data
Jun. 3, 2003 (TW) .............................. 92115150 A

(51) Int. Cl.
*H01L 21/50* (2006.01)
(52) U.S. Cl. ....................................................... 438/108
(58) Field of Classification Search ................. 438/108
See application file for complete search history.

(56) References Cited
U.S. PATENT DOCUMENTS 5,821,627 A * 10/1998 Mori et al. .................. 257/780
5,834,843 A * 11/1998 Mori et al. .................. 257/723
6,166,556 A * 12/2000 Wang et al. ................. 324/765
6,184,577 B1 * 2/2001 Takemura et al. ........... 257/701

OTHER PUBLICATIONS

Houldcroft, Peter Thomas, 1977, Press Syndicate of the University of Cambridge, Welding Process Technology, p. 215.*

* cited by examiner

*Primary Examiner*—Douglas W. Owens
(74) *Attorney, Agent, or Firm*—Birch, Stewart, Kolasch, and Birch, LLP

(57) ABSTRACT

A flip-chip attach method includes the steps of: attaching a chip on a transparent substrate such that each connecting pad of the chip is aligned with each electrical connection pad on the transparent substrate; and irradiating each connecting pad and each electrical connection pad from a side of the transparent substrate with a laser beam so as to weld the connecting pad to the electrical connection pad. Furthermore, the invention also provides a flip-chip attach structure including a transparent substrate and at least one chip. A surface of the transparent substrate is formed with a plurality of electrical connection pads, and the chip has a plurality of connecting pads. The connecting pads and the electrical connection pads are irradiated with a laser beam and are welded to each other. Thus, the chip is mounted to the transparent substrate.

8 Claims, 2 Drawing Sheets

FLIP-CHIP ATTACH STRUCTURE AND METHOD

This Non-provisional application claims priority under 35 U.S.C. § 119(a) on Patent Application No(s). 092115150 filed in Taiwan on Jun. 3, 2003, the entire contents of which are hereby incorporated by reference.

BACKGROUND OF THE INVENTION

1. Field of Invention

The invention relates to a flip-chip attach structure and a flip-chip attach method, and more particularly to a flip-chip attach structure and a flip-chip attach method for attaching a chip to a transparent substrate.

2. Related Art

In semiconductor package manufacturing processes, the flip-chip attach technology is widely used. The so-called flip-chip attach technology is, in brief, to form a plurality of protrusions on an active surface of a chip, and then to mount the chip on a substrate by the protrusions.

In general, the methods for attaching a chip to a substrate in a flip-chip manner are categorized into three kinds including a solder bump attach method, an anisotropic conductive adhesive film (ACF) attach method and a gold-to-gold pressing attach method. As shown in FIG. 1, the solder bump attach method is to form a solder bump 112 on a connecting pad 111 of a chip 11 in advance, and then the chip 11 is mounted on the substrate 12. As shown in FIG. 2 the ACF attach method is to form a gold bump 113 on a connecting pad 111 of a chip 11, and then an anisotropic conductive adhesive film 13 is used to adhere the chip to the substrate 12. As shown in FIG. 3, the gold-to-gold pressing attach method is to form a gold protrusion post 114 on a connecting pad 111 of a chip 11, and then the chip is mounted on the substrate 12 by way of direct pressing.

In the above-mentioned attach methods, the first and second methods are used frequently, wherein the first attach method is often used in the typical chip package processes while the second attach method is often used in the LCD manufacturing processes. In the LCD manufacturing processes, attaching the chip on the glass substrate are usually performed using the ACF attach method, and this technology is typically referred to as the COG (chip on glass) technology. The problem that the second attach method most frequently encounters is that the gold bump on the chip cannot completely contact the gold ball in the anisotropic conductive adhesive film, thereby reducing the product yield. In order to avoid this problem of the reduced yield, the areas of the connecting pad of the chip and the gold bump cannot be too small. This will limit the further shrinking of the chip area. In addition, because the anisotropic conductive adhesive film has to be adhered to the glass substrate, the transparent property of the glass substrate (transparent substrate) cannot be effectively utilized in some applications. In particular, it is inconvenient in the package application of the opto-electronic semiconductor chip.

Consequently, it is an important subject to provide a chip attach method capable of enhancing the connecting yield between the chip and the transparent substrate, optimized utilization of the transparent property of the transparent substrate, and reducing the area of the connecting pad on the chip.

SUMMARY OF THE INVENTION

In view of the above-mentioned problems, the invention is to provide a flip-chip attach method capable of enhancing the connecting yield between the chip and the transparent substrate, optimized utilization of the transparent property of the transparent substrate, and reducing the area of the connecting pad on the chip.

Furthermore, the invention is to provide a flip-chip attach structure capable of enhancing the connecting yield between the chip and the transparent substrate, optimized utilization of the transparent property of the transparent substrate, and reducing the area of the connecting pad on the chip.

To achieve the above, the invention provides a flip-chip attach method including the steps of attaching a chip on a transparent substrate and making each connecting pad on the chip in alignment with each electrical connection pad on the transparent substrate; and irradiating each connecting pad and each electrical connection pad with a laser beam from a side of the transparent substrate so as to weld the connecting pad to the electrical connection pad.

In addition, the flip-chip attach structure of the invention includes a transparent substrate and at least one chip, wherein a surface of the transparent substrate is formed with a plurality of electrical connection pads. The chip has connecting pads, which are respectively welded to the electrical connection pads by irradiating a laser beam, so that the chip is attached on the transparent substrate.

As mentioned above, the flip-chip attach structure and method of the invention weld the chip to the transparent substrate using a high-energy and precisely controlled laser beam. Thus, as long as the connecting pad is at the same surface height with or protrudes over the active surface of the chip, or the electrical connection pad is formed on the transparent substrate with a predetermined height, the connecting pad of the chip can be welded to the electrical connection pad of the transparent substrate. That is, even if no protrusion is formed on the connecting pad of the chip and the electrical connection pad of the transparent substrate, the chip still can be welded to the transparent substrate, so the connecting yield between the chip and the transparent substrate may be enhanced. In addition, because the substrate is a transparent substrate, it is possible to fully utilize its transparent property according to the flip-chip attach structure and method of the invention. Furthermore, because the flip-chip attach structure and method of the invention weld the chip to the transparent substrate with the laser beam, the area of the connecting pads of the chip and that of the electrical connection pads of the transparent substrate need not to be too large. And, even if no protrusion is formed on the connecting pads of the chip and the electrical connection pads of the transparent substrate, the chip still can be welded to the transparent substrate. In other words, the flip-chip attach structure and method of the invention are advantageous to the reducing of the area of the connecting pads on the chip.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The flip-chip attach method according to the preferred embodiment of the invention will be described with reference to the accompanying drawings. The flip-chip attach method according to the preferred embodiment of the invention is for attaching a chip on a transparent substrate, wherein the chip is formed with a plurality of connecting pads and a surface of the transparent substrate is formed with a plurality of electrical connection pads.

Figure 1:
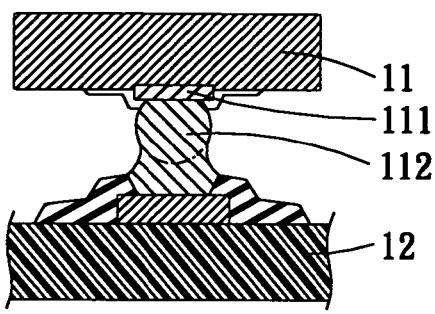
FIG. 1 is a schematic illustration showing a chip, which is mounted on a substrate using a conventional solder bump attach method.
Figure 2:
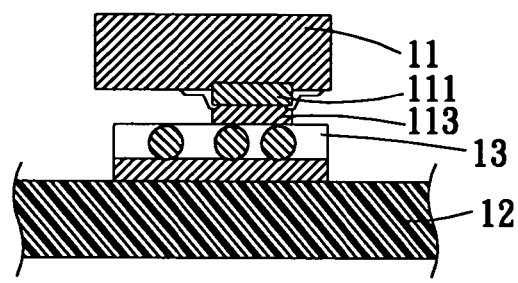
FIG. 2 is a schematic illustration showing a chip, which is mounted on a substrate using a conventional ACF (anisotropic conductive film) attach method.
Figure 3:
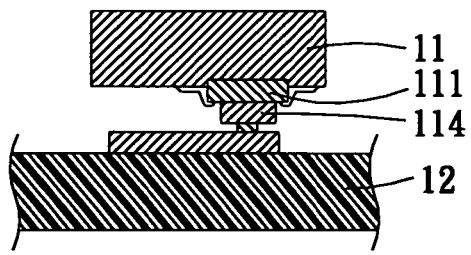
FIG. 3 is a schematic illustration showing a chip, which is mounted on a substrate using a conventional gold-to-gold pressing attach method.
Figure 4:
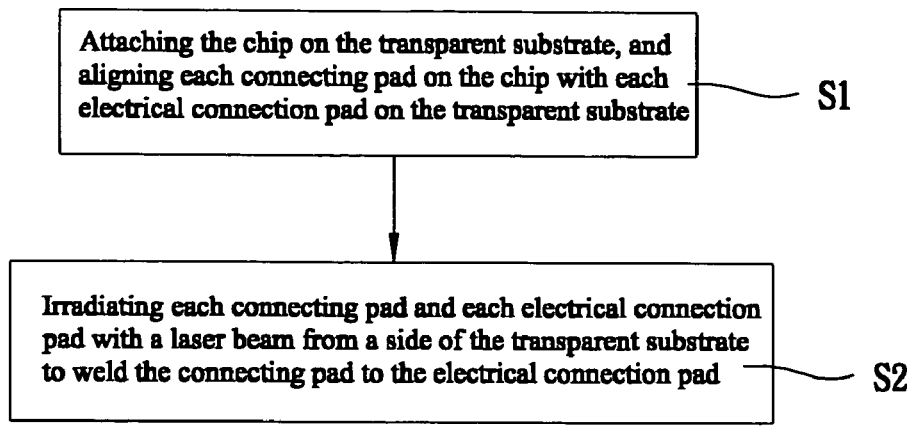
FIG. 4 is a flow chart showing a flip-chip attach method according to a preferred embodiment of the invention.

Referring to FIG. 4, the flip-chip attach method according to the preferred embodiment of the invention includes a step S1 and a step S2. In step S1, the chip is firstly attached on the transparent substrate and each connecting pad on the chip is in alignment with each electrical connection pad on the transparent substrate. In step S2, each connecting pad and each electrical connection pad are respectively irradiated with a laser beam from a side of the transparent substrate, so that the connecting pad is welded to the electrical connection pad. It is to be specified that when the connecting pad of the chip is directly attached to the electrical connection pad of the transparent substrate, the connecting pad of the chip is preferably at the same surface height with the active surface of the chip, or preferably protrudes over the active surface of the chip so as to be conveniently welded to the electrical connection pad of the transparent substrate. Of course, in order to facilitate the welding process, the electrical connection pad of the transparent substrate may have a predetermined height. In addition, in the flip-chip attach method of the invention, the transparent substrate may be a glass substrate.

In addition, in the flip-chip attach method of the invention, a protrusion, which may be a solder bump or a gold bump, may further be formed on each connecting pad of the chip. Of course, each electrical connection pad of the transparent substrate also may be formed with a protrusion, which may be a solder bump, or a gold bump. Consequently, the welding property between the chip and the transparent substrate may be further enhanced. That is, in the flip-chip attach method of the invention, each connecting pad may be directly welded to each electrical connection pad, or indirectly welded to each electrical connection pad via the protrusion.

As mentioned above, the flip-chip attach method of the invention welds the chip to the transparent substrate using a high-energy and precisely controlled laser beam. Thus, as long as the connecting pad is at the same surface height with or protrudes over the active surface of the chip, or the electrical connection pad is formed on the transparent substrate with a predetermined height, the connecting pad of the chip can be welded to the electrical connection pad of the transparent substrate. That is, even if no protrusion is formed on the connecting pad of the chip and the electrical connection pad of the transparent substrate, the chip still can be welded to the transparent substrate, so the connecting yield between the chip and the transparent substrate may be enhanced. In addition, in the flip-chip attach method of the invention, because the substrate is a transparent substrate, it is possible to fully utilize its transparent property. Furthermore, because the flip-chip attach method of the invention welds the chip to the transparent substrate with the laser beam, the area of the connecting pads of the chip and that of the electrical connection pads of the transparent substrate need not to be too large. In other words, the flip-chip attach method of the invention is advantageous to the reducing of the area of the connecting pads on the chip.

The flip-chip attach structure according to the preferred embodiment of the invention will be described with reference to FIGS. 5 and 6.

Figure 5:
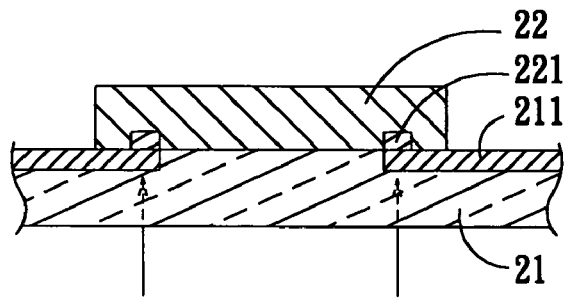
FIG. 5 is a schematic illustration showing a flip-chip attach structure according to the preferred embodiment of the invention.

With reference to FIG. 5, the flip-chip attach structure according to the preferred embodiment of the invention includes a transparent substrate 21 and at least one chip 22. The surface of the transparent substrate 21 is formed with a plurality of electrical connection pads 211. The chip 22 has a plurality of connecting pads 221, and the connecting pads 221 are respectively welded to the electrical connection pads 211 by irradiating a laser beam (the arrow in the drawing) to the pads from the opposite surface so that the chip 22 can be mounted on the transparent substrate 21. In this embodiment, the transparent substrate may be a glass substrate. In addition, when the connecting pad 221 of the chip 22 is directly attached to the electrical connection pad 211 of the transparent substrate 21, the connecting pad 221 of the chip 22 is preferably at the same surface height with or protrudes over the active surface of the chip 22 so as to facilitate the welding between the connecting pad 221 of the chip 22 and the electrical connection pad 211 of the transparent substrate 21. Of course, in order to facilitate the welding process, the electrical connection pad 211 of the transparent substrate 21 may have a predetermined height.

Figure 6:
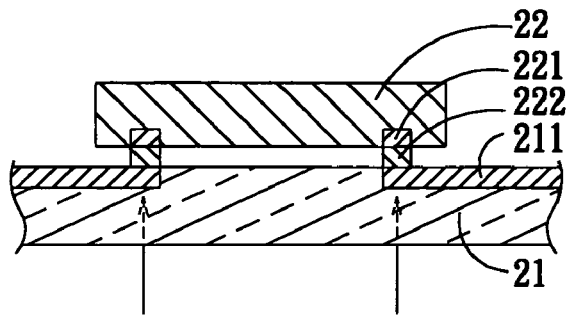
FIG. 6 is a schematic illustration showing another flip-chip attach structure according to another preferred embodiment of the invention.

In addition, as shown in FIG. 6, each connecting pad 221 of the chip 22 may further be formed with a protrusion 222, which may be a solder bump, or a gold bump. Of course, each electrical connection pad 211 of the transparent substrate 21 also may be formed with a protrusion (not shown), which may be a solder bump, or a gold bump. Consequently, the welding property between the chip 22 and the transparent substrate 21 could be enhanced. That is, in the flip-chip attach structure of the invention, each connecting pad 221 may be directly welded to each electrical connection pad 211 or indirectly welded to each electrical connection pad 211 via the protrusion.

As mentioned above, the flip-chip attach structure of the invention utilizes a high-energy and precisely controlled laser beam to weld the chip to the transparent substrate. Thus, as long as the connecting pad is at the same height with or protrudes over the active surface of the chip, or the electrical connection pad is formed on the transparent substrate with a predetermined height, the connecting pad of the chip can be welded to the electrical connection pad of the transparent substrate. That is, even if no protrusion is formed on the connecting pad of the chip and the electrical connection pad of the transparent substrate, the chip still can be welded to the transparent substrate, so the welding yield between the chip and the transparent substrate may be enhanced. In addition, because the substrate is a transparent substrate, it is possible to fully utilize its transparent property in the flip-chip attach structure of the invention. Furthermore, because the flip-chip attach structure of the invention welds the chip to the transparent substrate with the laser beam, the area of the connecting pads of the chip and that of the electrical connection pads of the transparent substrate need not to be too large. In other words, the flip-chip attach structure of the invention is advantageous to the reducing of the area of the connecting pads on the chip.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A flip-chip attach method for attaching a chip on a transparent substrate, wherein the chip is formed with a plurality of connecting pads, and the transparent substrate has one surface formed with a plurality of electrical connection pads and an opposite surface, the flip-chip attach method comprising:

attaching the chip to said one surface of the transparent substrate and aligning each of the connecting pads of the chip with each of the electrical connection pads of the transparent substrate; and irradiating each of the connecting pads and the electrical connection pads with a laser beam from the opposite surface of the transparent substrate by shining said laser beam through said transparent substrate and onto said electrical connection pads so as to weld the aligned connecting pads and the electrical connection pads to each other.

2. The method according to claim 1, wherein each of the connecting pads of the chip is further formed with a protrusion.

3. The method according to claim 2, wherein the protrusion is a solder bump.

4. The method according to claim 2, wherein the protrusion is a gold bump.

5. The method according to claim 1, wherein each of the electrical connection pads on the surface of the transparent substrate is further formed with a protrusion.

6. The method according to claim 5, wherein the protrusion is a solder bump.

7. The method according to claim 5, wherein the protrusion is a gold bump.

8. The method according to claim 1, wherein the transparent substrate is a glass substrate.

* * * * *